United States Patent
Taneja et al.

(10) Patent No.: US 9,535,121 B1
(45) Date of Patent: Jan. 3, 2017

(54) METHODS AND APPARATUSES TO ENHANCE TIMING DELAY FAULT COVERAGE WITH TEST LOGIC THAT INCLUDES PARTITIONS AND SCAN FLIP-FLOPS

(71) Applicant: Abreezio LLC, Sunnyvale, CA (US)

(72) Inventors: Sanjiv Taneja, Cupertino, CA (US); Bradley Quinton, Vancouver (CA); Andrew Hughes, Vancouver (CA); Trent McClements, Vancouver (CA)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 14/792,429

(22) Filed: Jul. 6, 2015

Related U.S. Application Data

(60) Provisional application No. 62/146,410, filed on Apr. 13, 2015.

(51) Int. Cl.
  *G01R 31/317* (2006.01)
  *G01R 31/3177* (2006.01)
  *G01R 31/3185* (2006.01)

(52) U.S. Cl.
  CPC ..... *G01R 31/3177* (2013.01); *G01R 31/31727* (2013.01); *G01R 31/318536* (2013.01); *G01R 31/318558* (2013.01); *G01R 31/318547* (2013.01)

(58) Field of Classification Search
  CPC .............. G01R 31/318536; G01R 31/318547; G01R 31/3177; G01R 31/318558; G01R 31/31727
  USPC .................................................. 714/726, 731
  See application file for complete search history.

(56) References Cited

U.S. PATENT DOCUMENTS

| | | | | |
|---|---|---|---|---|
| 6,145,105 | A * | 11/2000 | Nadeau-Dostie | G01R 31/31858 714/726 |
| 7,155,647 | B2 * | 12/2006 | Smith | G01R 31/318594 714/726 |
| 7,293,210 | B2 * | 11/2007 | Gunda | G01R 31/31858 326/16 |
| 7,296,249 | B2 * | 11/2007 | Rinderknecht | G01R 31/318547 714/25 |
| 7,308,631 | B2 | 12/2007 | McLaurin et al. | |
| 7,315,971 | B2 | 1/2008 | Grose et al. | |
| 7,937,634 | B2 * | 5/2011 | Almukhaizim | G06F 11/267 714/726 |
| 7,975,197 | B2 * | 7/2011 | Clark | G01R 31/318552 714/726 |
| 8,037,382 | B2 | 10/2011 | Gunasekar | |
| 8,205,125 | B2 * | 6/2012 | Hales | G01R 31/318533 714/727 |
| 8,607,107 | B2 * | 12/2013 | Cheng | G01R 31/318563 714/729 |

(Continued)

*Primary Examiner* — James C Kerveros
(74) *Attorney, Agent, or Firm* — Smith Tempel Blaha LLC

(57) ABSTRACT

Described herein are apparatuses and methods for enhancing timing delay fault coverage during testing of functional circuitry. In one embodiment, an apparatus includes functional circuitry for performing functional operations and test logic coupled to the functional circuitry to enhance timing delay fault coverage for the functional circuitry with at-speed test sequences. The test logic includes a plurality of partitions of scan flip-flops and an independent partition scan enable input signal for each partition for enabling or disabling each partition.

19 Claims, 15 Drawing Sheets

(56) References Cited

U.S. PATENT DOCUMENTS 8,645,778 B2     2/2014    Tekumalla et al.
8,887,018 B2    11/2014    Narayanan et al.

\* cited by examiner

METHODS AND APPARATUSES TO ENHANCE TIMING DELAY FAULT COVERAGE WITH TEST LOGIC THAT INCLUDES PARTITIONS AND SCAN FLIP-FLOPS

RELATED APPLICATION

This application claims the benefit of U.S. Provisional Application Ser. No. 62/146,410 filed on Apr. 13, 2015, entitled "Method and Apparatus to Enhance Timing Delay Fault Coverage", the entire contents of which are incorporated by reference.

TECHNICAL FIELD

Embodiments of the present invention relate to apparatuses and methods to enhance timing delay fault coverage with test logic that includes partitions and scan flip-flops.

BACKGROUND

Manufacturing of integrated circuits depends intimately on the ability to test a manufactured circuit to determine if it is fully functional. These tests determine if a circuit is suffering from a variety of faults, including stuck-at faults and transition delay faults. Stuck-at faults are manufacturing flaws that force a circuit node to have a constant value contrary to the designer's intent. Transition delay faults are manufacturing flaws that result in a circuit node that is slower than designed to respond to stimulus resulting in improper circuit operation at the designed operating speed. Determining if a circuit has either or both types of flaws is a critical part of modern integrated circuit design. Design for Test (DFT) is a methodology that describes inserting test fixtures into a design as part of the original specification. Automatic Test Pattern Generation (ATPG) combined with scan-chain insertion is a well-understood DFT method for creating patterns that when applied to a circuit are able to detect stuck-at faults. A variety of ad-hoc transition fault detection methods that leverage existing DFT structures are used in the industry.

In integrated circuit delay and stuck-at fault testing RAMs present a particular challenge since they are not easily loaded and unloaded. That is, RAMs do not have a simple load mechanism such as scan enable and scan in, nor a simple unload method such as scan enable and scan out. Rather, RAMs must be loaded with data via control, address and data inputs and the outputs driven by known data via a similar mechanism. In classic stuck-at or delay fault testing this provides a challenge because ensuring that the correct control signals are on the RAM input and output pins is difficult.

Delay fault test time is often dominated by scan-chain load sequences where the scan data is read from the tester into the device, particularly when the test vectors are targeting specific faults later in the test sequence. A means to reduce or minimize the number of load cycles will generally save tester time and cost.

Delay fault coverage is also affected by the operating conditions of the integrated circuit including phenomena such as temperature and power mesh response. As such the initialization vector (IV)-transition vector (TV) vector sequence many not accurately reflect the normal operating conditions of an integrated circuit resulting in overly pessimistic or optimistic fault coverage depending on the circuits response when exposed to the new operating conditions.

DFT strategies often have area and wiring overhead as a result of logical functionality to perform the strategy as well as the wiring required to connect the DFT structures. Minimizing the area and wiring overhead associated with DFT strategies is a concern.

SUMMARY

Described herein are apparatuses and methods for enhancing timing delay fault coverage during testing of functional circuitry. In one embodiment, an apparatus includes functional circuitry for performing functional operations and test logic coupled to the functional circuitry to enhance timing delay fault coverage for the functional circuitry with at-speed test sequences. The test logic includes a plurality of partitions of scan flip-flops and an independent partition scan enable input signal for each partition for enabling or disabling each partition. In one example, the test logic further includes override circuitry including at least one logic gate coupled to at least one scan flip-flop. At least one logic gate receives a scan enable input signal and a scan override input signal while generating the partition scan enable input signal that is sent to a corresponding scan flip-flop for enabling or disabling a test mode of the scan flip-flop.

BRIEF DESCRIPTION OF THE DRAWINGS

The present invention is illustrated by way of example, and not by way of limitation, in the figures of the accompanying drawings and in which.

DETAILED DESCRIPTION

Figure 1:
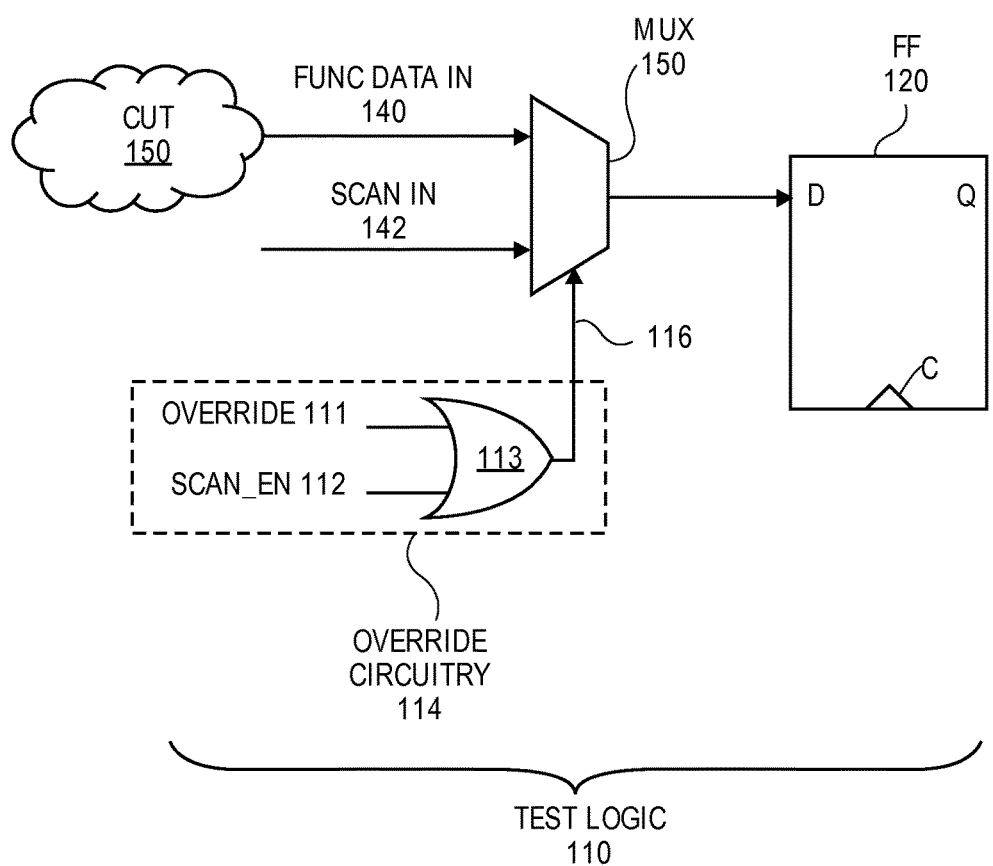
FIG. 1 illustrates an apparatus that includes test logic for enhanced timing delay fault coverage during a test mode of functional circuitry in accordance with one embodiment.

Described herein are apparatuses and methods for enhancing timing delay fault coverage during testing of functional circuitry. The present design includes a novel at-speed (e.g., at clock speed of functional circuitry during functional mode) mechanism to improve transition delay fault testing. In one embodiment, an apparatus includes functional circuitry for performing functional operations and test logic coupled to the functional circuitry to enhance timing delay fault coverage for the functional circuitry with at-speed test sequences. The test logic includes a plurality of partitions of scan flip-flops and an independent partition scan enable input signal for each partition for enabling or disabling each partition. In one example, the test logic further includes override circuitry including at least one logic gate coupled to at least one scan flip-flop. At least one logic gate receives a scan enable input signal and a scan override input signal while generating the partition scan enable input signal that is sent to a corresponding scan flip-flop for enabling or disabling a test mode of the scan flip-flop.

In another embodiment, an apparatus includes functional circuitry for performing functional operations and test logic coupled to the functional circuitry. The test logic enhances timing delay fault coverage for the functional circuitry with at-speed test sequences. The test logic includes partitions of scan flip-flops and an independent partition scan enable input signal for each partition for enabling or disabling each partition.

Transition delay fault models a slow signal change defect with each fault site having two possible faults—slow-to-rise and slow-to-fall. Delay fault testing requires the initialization of the device under test with one vector and stimulation of delay faults with a subsequent vector that generates transitions. The first vector is called the Initialization Vector (IV) and the second vector is called the Transition Vector (TV). The IV is often created by an ATPG tool and loaded into the device under test with a normal scan-chain insertion flow while the TV is dependent on the nature of the transition fault DFT mechanism. DFT mechanisms commonly used for transition fault detection are launch-on-capture (LoC), launch-on-shift (LoS) and enhanced scan.

Launch-on-capture (or double capture) is a delay fault mechanism where the IV is generated by the ATPG tool and directly loaded into the device flip-flops using the normal scan-chain DFT methodology. The tester then generates a pair of functional mode, at-speed clock pulses. The TV is generated from the IV on the first clock pulse and then used to capture transition faults on the second clock pulse. This method has the shortcoming that it is impossible to directly specify the TV resulting in lower test coverage compared with LOS.

Launch-on-shift (or skew capture) is a delay fault mechanism where the IV is generated by the ATPG tool and directly loaded into the device flip-flops using the normal scan-chain DFT methodology. The tester then generates a pair of at-speed clock pulses, the first in scan-mode to generate the TV and the second in functional mode to capture transition faults. The TV is generated from the IV by a single bit shift. This method has the shortcoming that the scan enable signal is difficult to time and must be made to operate at-speed in this mechanism. In addition the TV becomes closely correlated to the IV.

These mechanisms result in insufficient control over test vectors resulting in a large vector count and/or a low fault coverage.

The idea of RAM clock-through, where RAMs are loaded with data via multiple IV clock cycles, has been used in the industry. However, getting direct control of the RAM inputs and outputs has proved difficult due to the nature of the IV clock cycle, similar to the insufficiencies of launch-on-capture for standard cell logic.

In order to mimic normal operating conditions functional at-speed vectors are employed. Functional at-speed vectors scan in an initial state into the device, run the circuit for multiple, sometimes thousands, of functional mode clock cycles and then scan out the flip-flop data. These patterns are compared against expected results. These vectors, while mimicking the operating conditions of the device, suffer from issues such as fault masking where a transition or path fault occurs but the result is masked during the subsequent functional mode clock cycles of that particular test vector. Further, the limit of only having control of one clock cycle of initial state limits the effectiveness of the vector set.

In order to minimize the impact of scan-based DFT insertion the ordering on the flip-flops associated with each chain is structured such that total wire length is minimized. This is known as physically aware scan-chain ordering or stitching.

The present design includes a novel at-speed (e.g., at clock speed of functional circuitry during functional mode) mechanism to improve transition delay fault testing. This design combines the benefits of launch-on-shift and launch-on-capture TDF by keeping Flip-Flops that are difficult to control in shift mode while all other flops are in capture mode.

FIG. 1 illustrates an apparatus that includes test logic for enhanced timing delay fault coverage during a test mode of functional circuitry in accordance with one embodiment. The apparatus 100 (e.g., integrated circuit, circuit, device, etc.) includes functional circuitry 150 (e.g., circuit under test (CUT) 150) and test logic 110 which includes a multiplexer 150, override circuitry 114 (e.g., OR logic) and a flip-flop (FF) 120 that is a circuit with two stable states to store state information (e.g., a bit) for sequential logic. The FF 120 captures a value of a D input at a definite portion of a clock C cycle (e.g., rising edge of clock cycle). The captured value becomes a Q output value. A select signal 116 of the multiplexer 150 determines whether the FF 120 operates in a functional mode with input (e.g., functional data in) being loaded into the D input from functional circuitry, circuit under test (CUT) 150, or operates in a test mode with input being loaded into from a scan in signal 142. A scan enable signal 112 lacks controllability in traditional approaches particularly for double clock capture methods. In FIG. 1, the scan enable signal is gated with a logic gate (e.g., an OR gate 113) of the override circuitry controlled by override signal 111 which is set to a first logic level (e.g., "1", "0") during the entire pattern that the identified Flip-Flop(s) needs to be controlled. The override signal 111 provides an ability to insert known test values for timing delay fault testing for certain selected flip-flops. The override circuitry 114 can be included on-chip with the test logic 110 or can be located at a separate location (e.g., tester, ATE, etc.). In one example, the override circuitry 114 generates an input signal 116 that is a direct input node or pin for the test logic of the apparatus 100.

Figure 2:
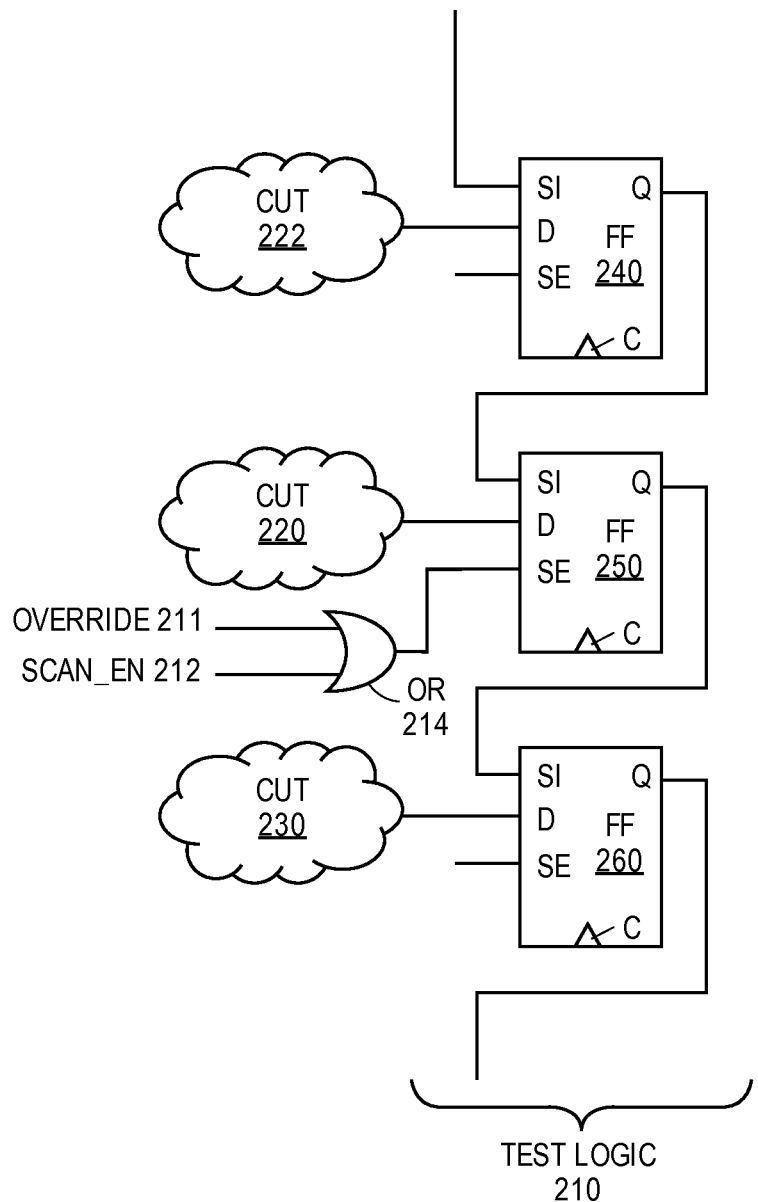
FIG. 2 illustrates an apparatus 200 having test logic for enhanced timing delay fault (TDF) coverage during a test mode of functional circuitry in accordance with one embodiment.

FIG. 2 illustrates an apparatus 200 having test logic for enhanced timing delay fault (TDF) coverage during a test mode of functional circuitry in accordance with one embodiment. The apparatus 200 (e.g., integrated circuit, circuit, device, etc.) includes test logic 210 which includes flip-flops (FF) 240, 250, and 260 coupled in a scan chain in a shift mode during scan capture. Each FF includes a D input, a Q output, a scan input (SI), a SE, and a clock C. The D input of each FF is coupled to functional circuitry (e.g., CUT 222, CUT 220, CUT 230). A Scan_En (SE) of each FF determines whether the FF operates in a functional mode with input being loaded into the D input from functional circuitry or operates in a test mode with input being loaded into a scan input. In FIG. 2, the SE of FF 250 is coupled to a logic gate (e.g., an OR gate 214) controlled by override signal 211 which is set to a first logic level (e.g., "1", "0") during the entire pattern that the identified Flip-Flop(s) needs to be controlled. The override signal and scan enable signal can be applied selectively to any flip-flip if desired for controlling the FF during a test mode.

During the pattern that the override signal 211 is active (e.g., a first logic level), the input to the identified Flip-Flop 250 is controlled through its preceding Flip-Flop 240 in the scan chain providing complete control during TDF launch as the value of both Flip-Flops could be shifted in. At least in some patterns, the override signal 211 needs to be set to a second logic level (e.g., "0") so that normal scan operation is resumed to recover lost coverage at the input of the Flip-Flops that need to be controlled.

Figure 3:
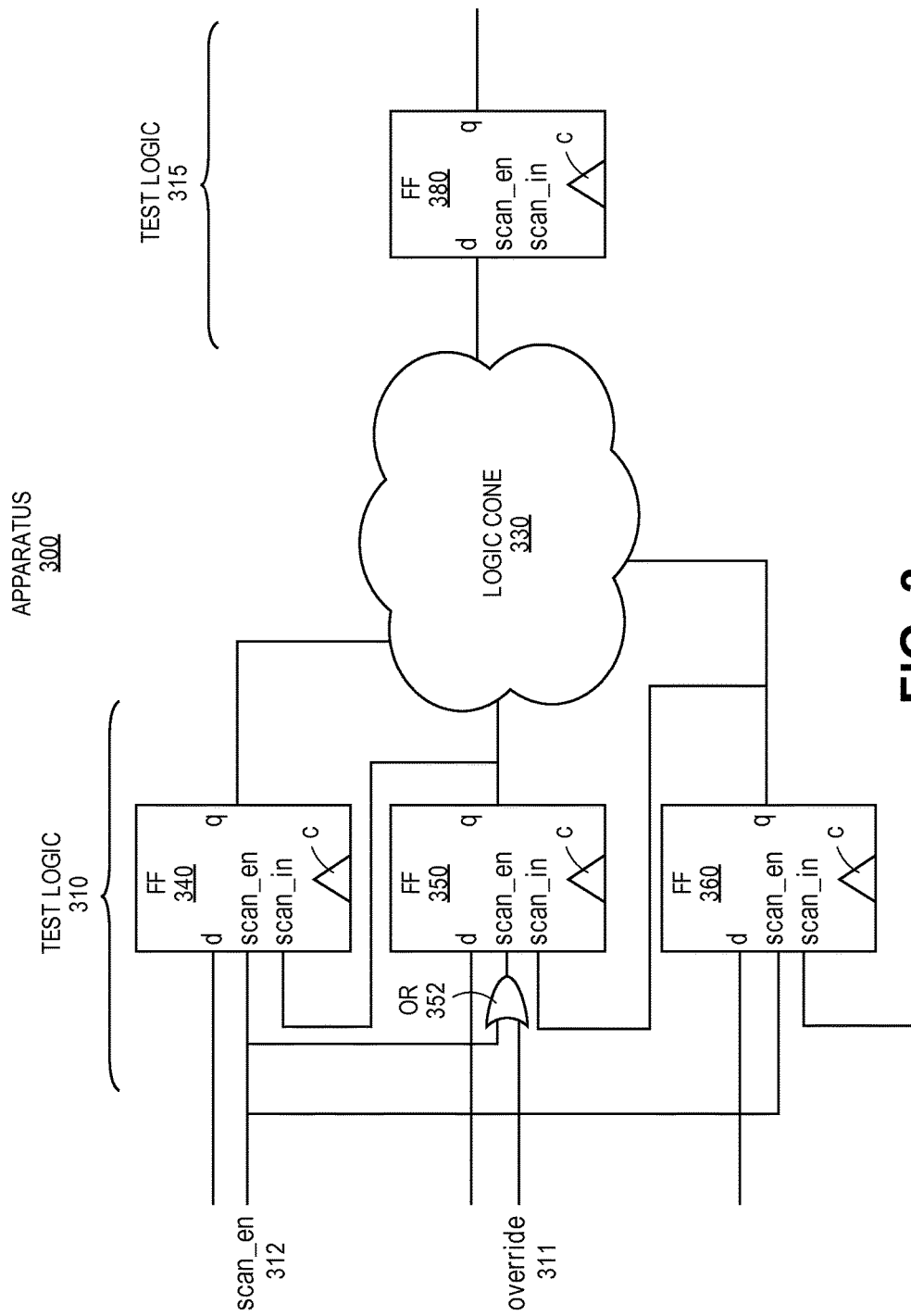
FIG. 3 illustrates an apparatus 300 having test logic for enhanced timing delay fault (TDF) coverage during a test mode of functional circuitry in accordance with one embodiment.

FIG. 3 illustrates an apparatus 300 having test logic for enhanced timing delay fault (TDF) coverage during a test mode of functional circuitry in accordance with one embodiment. The apparatus 300 (e.g., integrated circuit, circuit, device, etc.) includes test logic 310 and 315. Test logic 310 includes flip-flops (FF) 340, 350, and 360 coupled in a scan chain in a shift mode during scan capture. Each FF includes a D input, a Q output, a scan input (scan_in), a scan_enable input, and a clock C. The D input of each FF receives input values (e.g., data for loading into a logic cone 330 during a functional mode, an initialization vector (IV) for initializing state information for a test mode, one or more transition vectors (TV) for transitioning state information of the logic cone 330 during a test mode, etc.) which become Q output values for loading into functional circuitry of the logic cone 330. A Scan_En (SE) of each FF determines whether the FF operates in a functional mode with input being loaded from the D input or operates in a test mode with input being loaded from a scan input for loading or launching a test pattern or test vectors into the logic cone 330 in a test mode to test for faults in the functional circuitry of the logic cone 330. In FIG. 3, the scan_en of FF 350 is coupled to a logic gate (e.g., an OR gate 352) controlled by override signal 311 which is set to a first logic level (e.g., "1", "0") during the entire test pattern that the identified Flip-Flop(s) needs to be controlled during the test mode. The override signal and scan enable signal can be applied selectively to any flip-flip if desired for controlling the FF during a test mode.

During the pattern that the override signal 311 is active (e.g., a first logic level), the input to the identified Flip-Flop 350 is controlled through a different Flip-Flop 360 in the scan chain providing 100% control during TDF launch as the value of the Flip-Flops could be shifted in. At least in some test patterns, the override signal 311 needs to be set to a second logic level (e.g., "0") so that normal scan operation is resumed to recover lost coverage at the input of the Flip-Flops that need to be controlled.

A capture flip-flop 380 captures values from the logic cone 330 via a D input. This input upon a certain portion of a clock C becomes a Q output. The Q output can be loading into another logic cone or it can be captured for analysis by a test program to determine whether faults exist within the logic cone 330.

Figure 4:
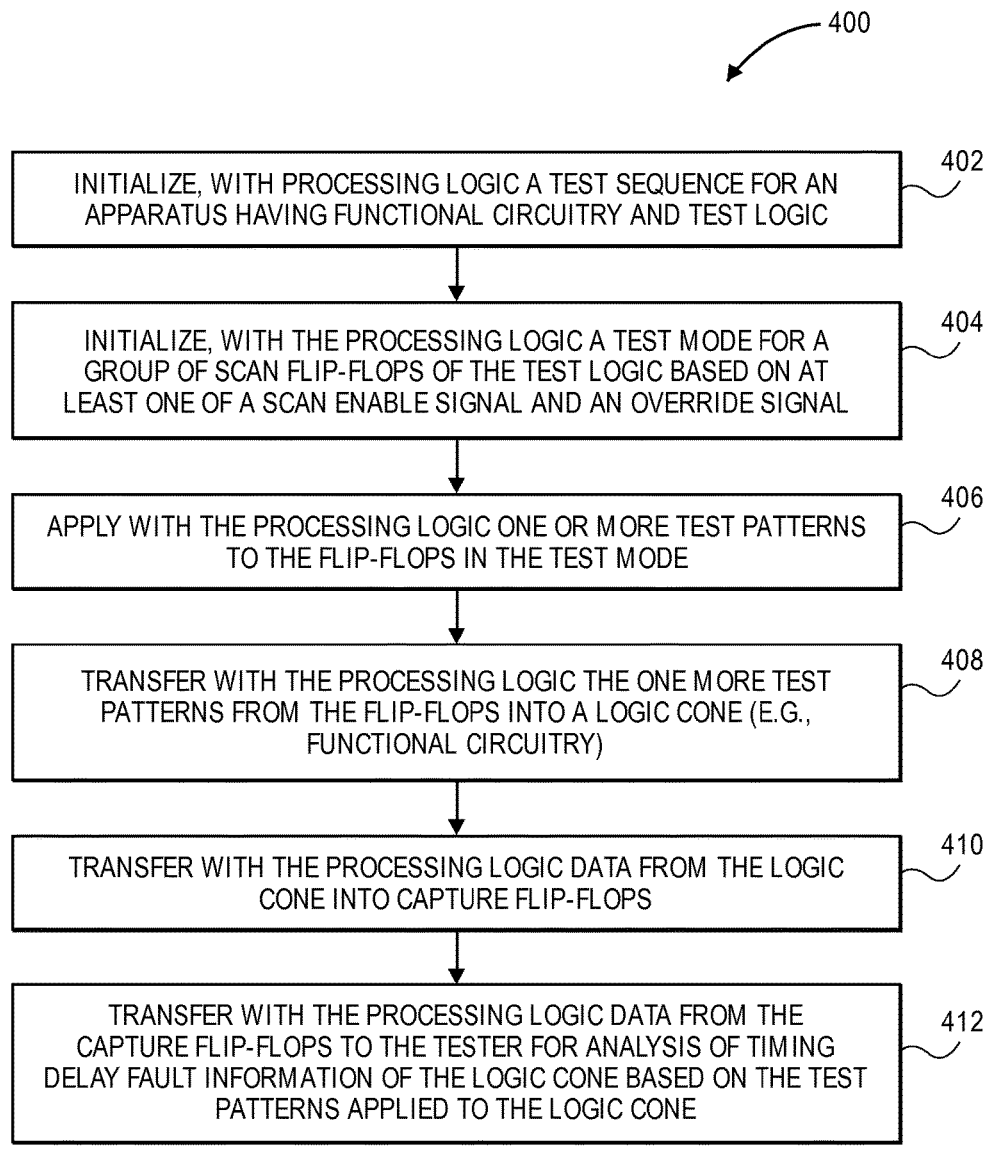
FIG. 4 illustrates a method for enhanced timing delay fault (TDF) coverage during a test mode of functional circuitry in accordance with one embodiment.

FIG. 4 illustrates a method for enhanced timing delay fault (TDF) coverage during a test mode of functional circuitry in accordance with one embodiment. An apparatus (e.g., integrated circuit, circuit, device, etc.) includes functional circuitry for performing functional operations and test logic coupled to the functional circuitry to enhance timing delay fault coverage for the functional circuitry. Processing logic of a tester (e.g., automated test equipment) executes software instructions to perform operations of the method 400. Processing logic can comprise hardware (e.g., circuitry, dedicated logic, programmable logic, microcode, etc.), software (such as instructions run on a processing device), or a combination thereof.

At operation 402, processing logic initializes a test sequence for an apparatus having functional circuitry and test logic. The apparatus can be operated in a functional mode or a test mode. At operation 404, processing logic initializes a test mode for a group of scan flip-flops of the test logic based on at least one of a scan enable signal and an override signal. The scan flip-flops are arranged in at least one scan chain and at least one scan override input signal can be applied selectively for overriding at least one scan enable input signal of at least one scan flip-flop. At operation 406, the processing logic applies one or more test patterns to the flip-flops in the test mode. At operation 408, the processing logic transfers the one or more test patterns from the flip-flops into a logic cone (e.g., functional circuitry). The test patterns can include initialization vectors and transition vectors for transitioning state information of the logic cone. At operation 410, the processing logic transfers data from the logic cone into capture flip-flops. At operation 412, the processing logic transfers data from the capture flip-flops to the tester for analysis of timing delay fault information of the logic cone based on the test patterns applied to the logic cone.

Figure 5:
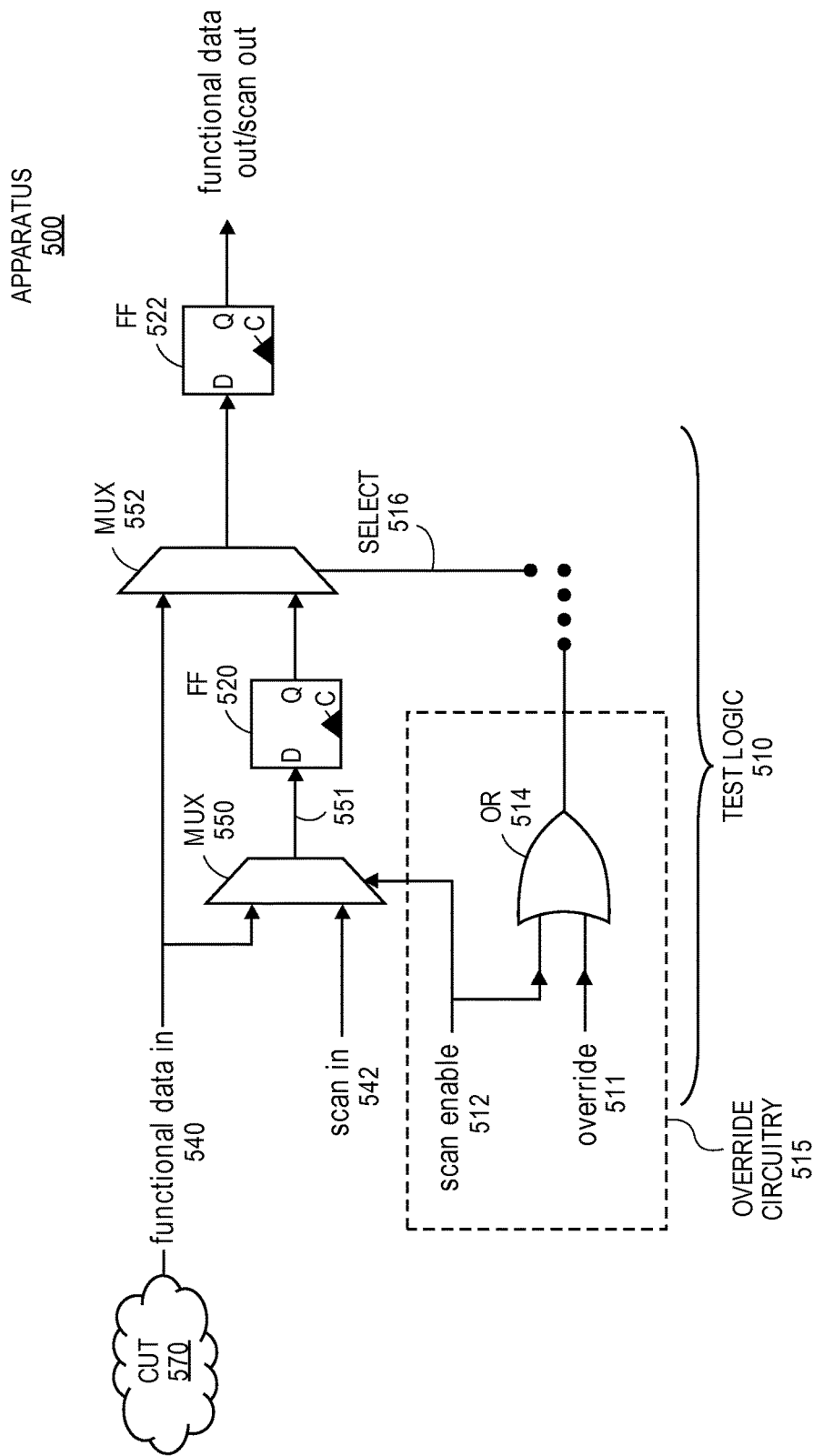
FIG. 5 illustrates an apparatus that includes test logic for enhanced timing delay fault coverage during a test mode of functional circuitry in accordance with one embodiment.

Another design includes insertion of an extra scan Flip-Flop in addition to a scan Flip-Flop that is being controlled. The extra scan Flip-Flip stores data for the controlled scan Flip-Flop during a second clock cycle of a test pattern. FIG. 5 illustrates an apparatus that includes test logic for enhanced timing delay fault coverage during a test mode of functional circuitry in accordance with one embodiment. The apparatus 500 includes functional circuitry 570 (e.g., circuit under test (CUT) 570) and test logic 510 which includes a multiplexer 550, override circuitry 515 (e.g., OR gate logic 514), a flip-flop (FF) 520, a Flip-Flop 522, and a multiplexer 552. The FF 520 captures a value of a D input at a definite portion of a clock C cycle (e.g., rising edge of clock cycle). The captured value becomes a Q output value. A scan enable signal 512 determines whether the multiplexer 550 selects functional data in signal 540 from CUT 570 (e.g., functional circuitry) or scan in signal 542. An output signal 551 of the multiplexer is loaded into the D input of the FF 520.

The override circuitry 515 (e.g., a logic gate 514) receives a scan enable signal 512 and an override signal 511 as input signals. The logic gate 514 (e.g., OR logic gate 514, equivalent logic gate, etc.) outputs a select signal 516 of the multiplexer 550 and this select signal determines whether the FF 522 operates in a functional mode with input (e.g., functional data in 540) being loaded into the D input from functional circuitry, circuit under test (CUT) 570, or operates in a test mode with input being loaded into from a scan in signal 542 via FF 520. A scan enable signal 512 lacks controllability in traditional approaches. In FIG. 5, the scan enable signal is gated with a logic gate (e.g., an OR gate 514) controlled by override signal 511 which is set to a first logic level (e.g., "1", "0") during the entire pattern that the identified Flip-Flop(s) needs to be controlled. The override circuitry 515 can be included on-chip with the test logic 510 or can be located at a separate location (e.g., tester, ATE, etc.). In one example, the override circuitry 515 generates an input select signal 516 that is a direct input node or pin for the test logic of the apparatus 500.

Figure 6:
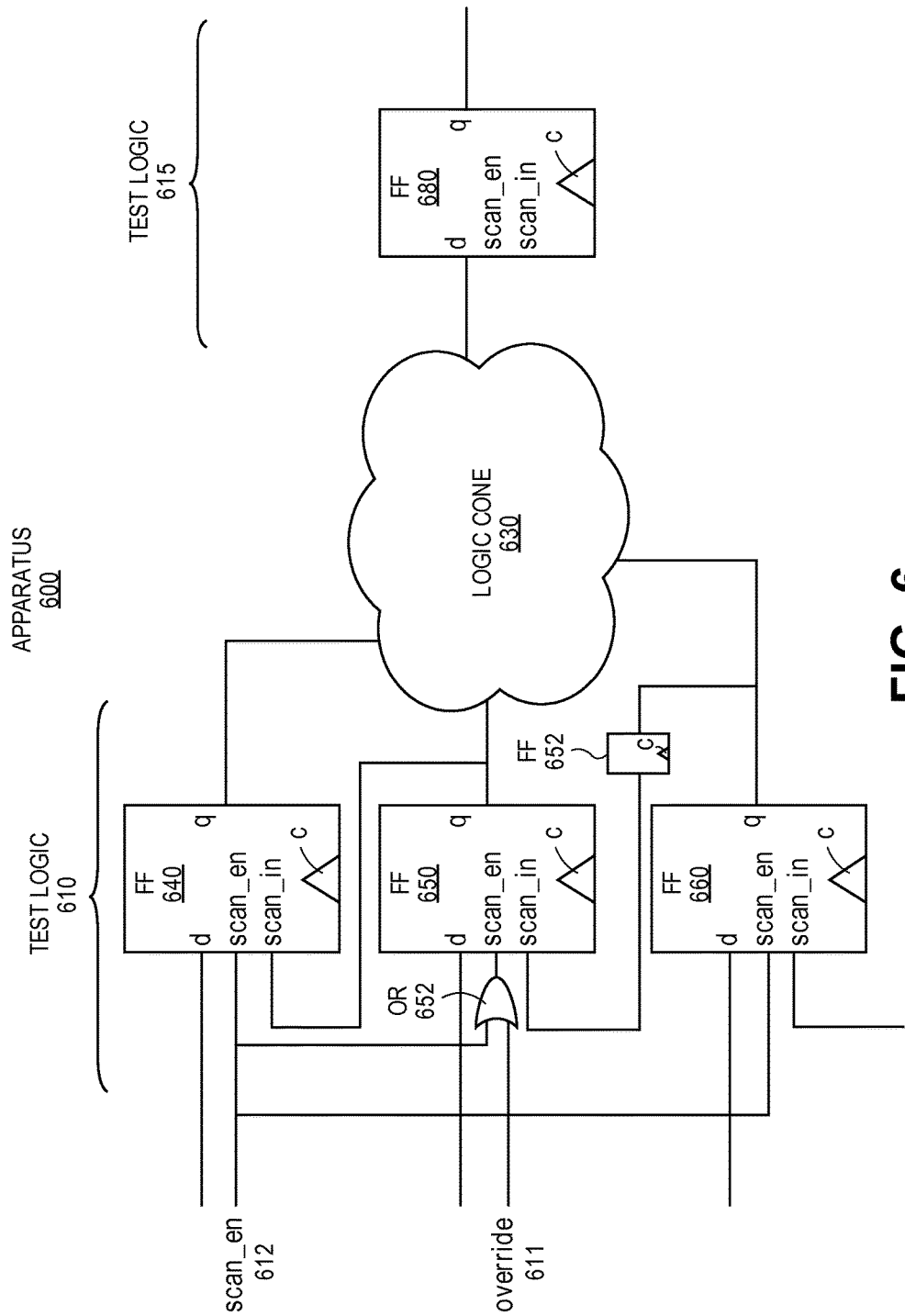
FIG. 6 illustrates an apparatus 600 having test logic for enhanced timing delay fault (TDF) coverage during a test mode of functional circuitry in accordance with one embodiment.

FIG. 6 illustrates an apparatus 600 having test logic for enhanced timing delay fault (TDF) coverage during a test mode of functional circuitry in accordance with one embodiment. The apparatus 600 (e.g., integrated circuit, circuit, device, etc.) includes test logic 610 and 615. Test logic 610 includes flip-flops (FF) 640, 650, and 660 coupled in a scan chain in a shift mode during scan capture. Each FF includes a D input, a Q output, a scan input (scan_in), a scan_enable input, and a clock C. The D input of each FF receives input values (e.g., data for loading into a logic cone 630 during a functional mode, an initialization vector (IV) for initializing state information for a test mode, one or more transition vectors (TV) for transitioning state information of the logic cone 630 during a test mode, etc.) which become Q output values for loading into functional circuitry of the logic cone 630. A Scan_En (SE) of each FF determines whether the FF operates in a functional mode with input being loaded into the D input or operates in a test mode with input being loaded into a scan input for loading or launching a test pattern or test vectors into the logic cone 630 in a test mode to test for faults in the functional circuitry of the logic cone 630. In FIG. 6, the scan_en of FF 650 is coupled to a logic gate (e.g., an OR gate 652) controlled by override signal 611 which is set to a first logic level (e.g., "1", "0") during the entire test pattern that the identified Flip-Flop(s) needs to be controlled during the test mode. The override signal and scan enable signal can be applied selectively to any flip-flip if desired for controlling the FF during a test mode.

During the pattern that the override signal 611 is active (e.g., a first logic level), the input to the identified Flip-Flop 650 is controlled through a different Flip-Flop 660 in the scan chain and a storage Flip-Flip 652 providing 100% control during TDF launch as the value of the Flip-Flops could be shifted in. Q (or Scan_out) of the preceding flip-flop 660 is connected to SI (Scan Input) of the new test point Flip-Flop 652. Q of the new test point Flip-Flop 652 is connected to SI of the Flip-Flop 650 that need to be controlled.

At least in some test patterns, the override signal 611 needs to be set to a second logic level (e.g., "0") so that normal scan operation is resumed to recover lost coverage at the input of the Flip-Flops that need to be controlled.

A capture flip-flop 680 captures values from the logic cone 630 via a D input. This input upon a certain portion of a clock C becomes a Q output. The Q output can be loading into another logic cone or it can be captured for analysis by a test program to determine whether faults exist within the logic cone 630.

Figure 7:
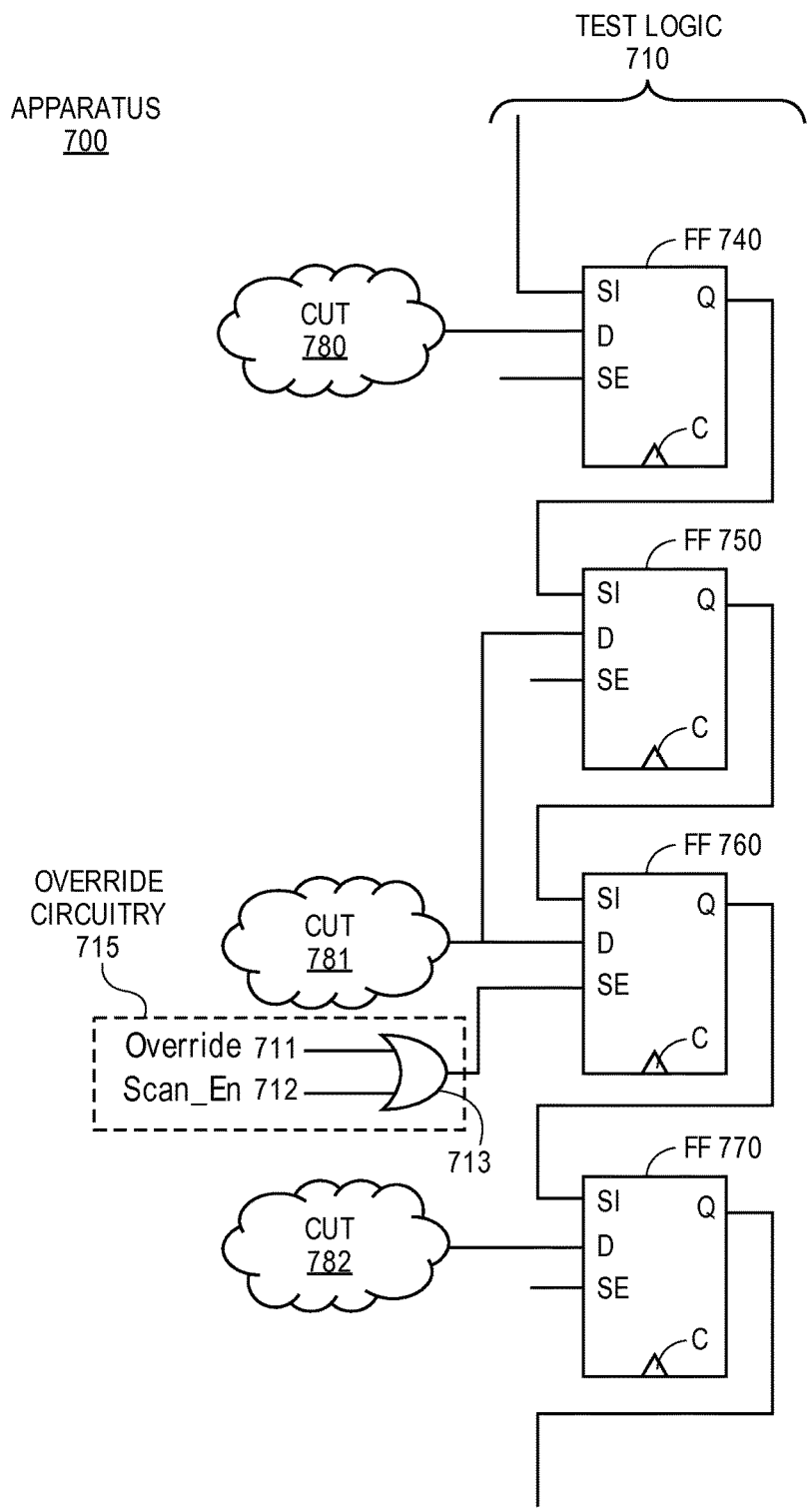
FIG. 7 illustrates an apparatus 700 having test logic for enhanced timing delay fault (TDF) coverage during a test mode of functional circuitry in accordance with one embodiment.

FIG. 7 illustrates an apparatus 700 having test logic for enhanced timing delay fault (TDF) coverage during a test mode of functional circuitry in accordance with one embodiment. The apparatus 700 (e.g., integrated circuit, circuit, device, etc.) includes test logic 710. Test logic 710 includes flip-flops (FF) 740, 750, 760, and 770 coupled in a scan chain in a shift mode during scan capture. Each FF includes a D input, a Q output, a scan input (SI), a scan_enable input (SE), and a clock C. The D input of each FF receives input values from a respective circuit under test (e.g., CUT 780, CUT 781, CUT 782) that can be functional data during a functional mode or test data obtained during a test mode. The Q output values can be analyzed during a test mode to determine timing delay faults for the circuits under test. A Scan_En (SE) of each FF determines whether the FF operates in a functional mode with input being loaded into the D input or operates in a test mode with input being unloading test data from a circuit under test. In FIG. 7, the scan_en of FF 760 is coupled to override circuitry 715 having a logic gate (e.g., an OR gate 712) controlled by override signal 711 which is set to a first logic level (e.g., "1", "0") during the entire test pattern that the identified Flip-Flop(s) needs to be controlled during the test mode. The override signal and scan enable signal 712 can be applied selectively to any flip-flip if desired for controlling the FF during a test mode.

During the pattern that the override signal 711 is active (e.g., a first logic level), the input to the identified Flip-Flop 760 is controlled through a different Flip-Flop 750 in the scan chain providing 100% control during TDF launch as the values of the Flip-Flops could be shifted in. Q (or Scan_out) of the preceding flip-flop 740 is connected to SI (Scan Input) of a new test point Flip-Flop 750. Q of the new test point Flip-Flop 750 is connected to SI of the Flip-Flop 760 that need to be controlled. D inputs of the Flip-Flop that needs to be controlled and the new test point Flip-Flop can be connected.

Therefore, the present design mechanism replaces selected DFT scan flip-flops with enhanced elements as shown in FIGS. 1-3 and 5-7 that permit control over the Transition Vector (TV) generated in a launch-on-capture delay fault scheme. The present design mechanism substitutes scan flip-flops with versions that have an override that allows control of where selected portions of the TV vector will be obtained. It should be noted that several override signals can be used with each override signal controlling a set of flip-flops. This will allow various sets of flip-flops to be independently controlled.

In another embodiment, a design for test partitions flip-flops into at least 2 different groups (e.g., 2 groups, 3 groups, 4 groups, etc.). This design reorders and segregates scan enable signals that permit control over the Transition Vector (TV). This design can reorder flip-flops arranged into a scan chain into non-self interacting sets and then interleaves these sets. Each set is provided with an independent scan enable as opposed to having dedicated override signals but still using one global scan enable signal. Selective control of the independent scan enable signals results in the initialization vector (IV) being generated by one set of flip-flops and the TV vector generated by the other set of flip-flops in the case of two sets or groups. The set generating the IV vector is held in scan so that the first double capture clock launches the IV vector and then updates with the TV vector. The second double capture clock launches the TV vector. At the end of the double-capture clock, both the stuck-at fault results tested by the IV and the transition delay fault results tested by TV are available.

Figure 8:
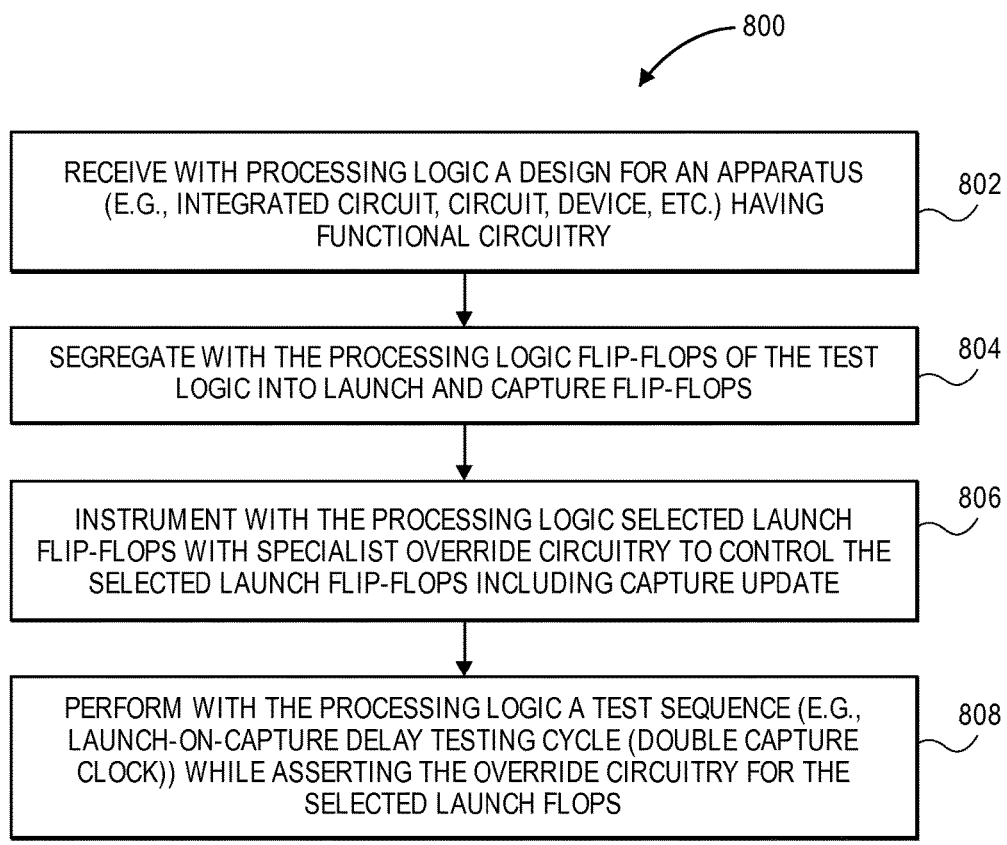
FIG. 8 illustrates a method for enhanced timing delay fault (TDF) coverage based on using multiple partitions of flip-flops during a test mode of functional circuitry in accordance with one embodiment.

FIG. 8 illustrates a method for enhanced timing delay fault (TDF) coverage based on using multiple partitions of flip-flops during a test mode of functional circuitry in accordance with one embodiment. An apparatus includes functional circuitry for performing functional operations and test logic coupled to the functional circuitry to enhance timing delay fault coverage for the functional circuitry. Processing logic of a tester (e.g., automated test equipment) executes software instructions to perform operations of the method 800. Processing logic comprises hardware (e.g., circuitry, dedicated logic, programmable logic, microcode, etc.), software (such as instructions run on a processing device), or a combination thereof.

At operation 802, processing logic receives a design for an apparatus (e.g., integrated circuit, circuit, device, etc.) having functional circuitry. The apparatus with embedded instrumentation can be operated in a functional mode or a test mode. The processing logic designs customized test logic for optimizing testing efficiency, measurements, and an ability to determine timing delay faults. At operation 804, the processing logic segregating flip-flops of the test logic into launch and capture flip-flops. At operation 806, the processing logic instruments selected launch flip-flops with specialist override circuitry to control the selected launch flip-flops including capture update. At operation 808, the processing logic performs a test sequence (e.g., launch-on-capture delay testing cycle (double capture clock)) while asserting the override circuitry for the selected launch flops. The override circuitry permits partial control of a transition vector (TV) of a test sequence rather than having the TV derived from IV by the functional logic.

Examples of override circuitry include selected scan enable override circuitry, selected enhanced scan circuitry, and selected alternate update circuitry. In one example, the selected scan enable override circuitry includes selected launch flip-flops that are held in scan mode such that data values obtained for the transition test vector (TV) are obtained from a scan chain of flip-flops rather than the functional circuitry. In another example, selected enhanced scan circuitry includes selected launch flip-flops that are paired with a dedicated extra flop to hold the transition test vector (TV). This permits arbitrary control over TV for the selected launch flip-flops and enhanced observability.

In another example, selected alternate update circuitry includes selected launch flip-flops that are paired with non-launch flip-flops and the TV update value(s) is obtained from the non-launch flip-flops. In the pairing process, the flip-flop location can be factored in such that the total length of wiring required for the connecting (e.g., stitching) of flip-flop scan chains is minimized.

The override circuitry can be enabled either on a per-launch flip-flop basis or on groups of launch flip-flops. The combination of partitioning into launch or capture flip-flops and grouping the launch flip-flops by override circuitry creates scan chain partitions. Complete scan chain partitioning creates independent scan chains without the need for explicit per flip-flop override circuitry and enables combined transition delay fault and stuck-at fault testing. It should also be noted in this alternative override circuitry, several scan enable domains are each being independently controlled.

Figure 9A:
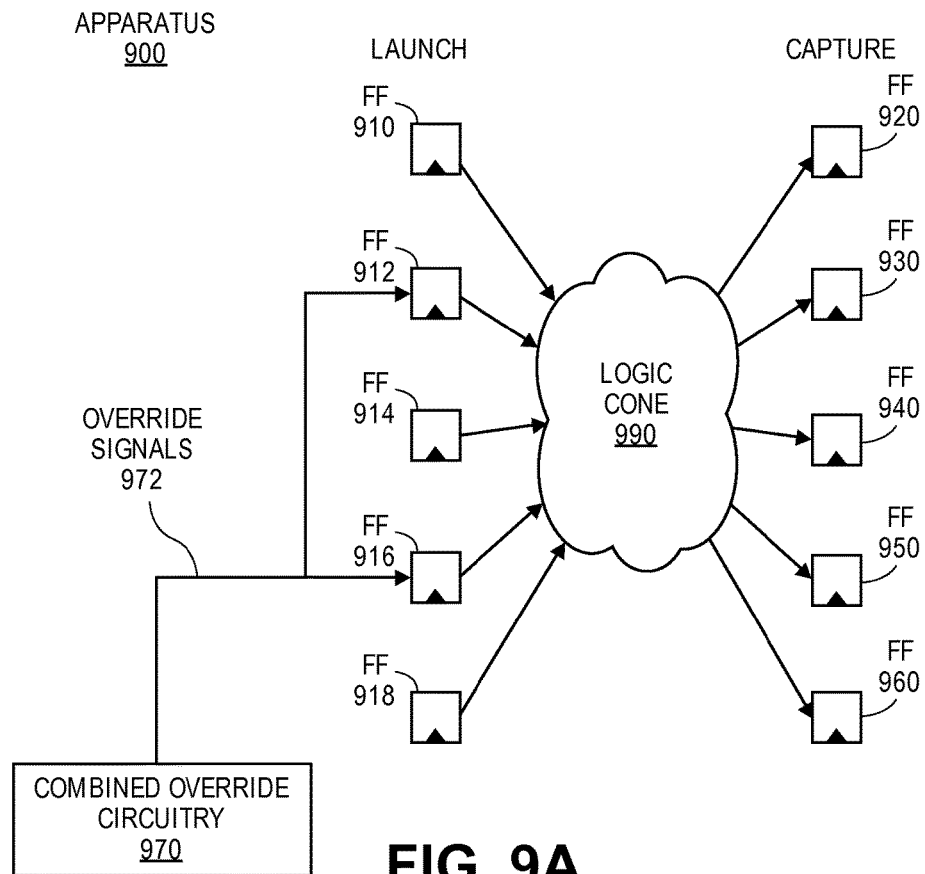
FIG. 9A illustrates an apparatus having customized test logic in which launch flip-flops and capture flip-flops of the test logic have been partitioned in accordance with one embodiment.

FIG. 9A illustrates an apparatus having customized test logic in which launch flip-flops and capture flip-flops of the test logic have been partitioned in accordance with one embodiment. The apparatus 900 (e.g., integrated circuit, circuit, device, etc.) includes launch flip-flops 910, 912, 914, 916, and 918 and capture flip-flops 920, 930, 940, 950, and 960. A combined override circuitry 970 generates one or more override signals 972 for flip-flops 912 and 916. The launch flip-flops in FIG. 9A will capture data for a TV for logic cone 990 as in a launch-on-capture delay fault test scheme. A specific launch flip-flop can be chosen to instrument with the scan enable override DFT instruments included in override circuitry 970 in FIG. 9A and similarly illustrated as override circuitry 114 in FIG. 1. The scan override permits a tester (e.g., ATE) to force any combination of the selected flip-flops to remain in scan mode even when the device is used in normal capture test mode. A tester generates ATPG vectors for transition fault detection using a launch-on-capture delay fault mechanism. The override control of the combined override circuitry 970 is used to ensure that the selected launch flip-flops will update with data from the scan chain rather than data generated in a functional mode from the logic cone 990. This permits a degree of flexibility in pattern generation for TV that reduces a number of test patterns required for testing timing delay faults of the logic cone 990. Selecting flip-flops for scan override insertion provides increased delay vector coverage. This permits more flexibility in the specification of a TV than just launch-on-capture. It is a useful combination of launch-on-capture and launch-on-shift without the timing difficultly of launch-on-shift.

The override signals can be controlled via device pins of the apparatus or internal logic (e.g., combined override circuitry 95). FIG. 9A shows the case where the override signals are controlled via flip-flops and these flip-flops are loaded during the IV vectors.

In one example, DFT flip-flops are separated into launch and capture flip-flops as shown in FIG. 9A. All launch flip-flops in FIG. 9A will capture data for a TV as in a launch-on-capture delay fault test regime. At least one specific launch flip-flop is chosen to instrument with the enhanced scan DFT instruments (e.g., override circuitry, additional flip-flop) as shown in FIGS. 5-7. The enhanced scan permits the tester to force any combination of the enhanced flip-flops to update with chosen data rather than data generated in a functional mode by functional circuitry. The tester generates ATPG vectors for transition fault detection using a launch-on-capture delay fault mechanism. Next, the TV pattern is examined and generated by the functional circuitry or logic in a normal launch-on-capture scheme and this generates additional vectors by using the selected enhanced scan flip-flops to inject data that increases test coverage. The flexibility the enhanced scan provides decreases the total vectors required and increases coverage. Selecting flip-flops for enhanced scan insertion provides increased test coverage. This provides a useful combination of launch-on-capture and enhanced capture without the expense of complete enhanced scan.

For both the selected scan enable override and the selected enhanced scan the override inputs can be combined as shown in FIG. 9A. This figure shows that the selected flip-flops 912 and 916 are all either overridden or all operating in normal launch-on-capture mode. This low-cost flexibility enables enhanced coverage at a relatively low logic gate cost in terms of area consumed by the logic gates.

Figure 9B:
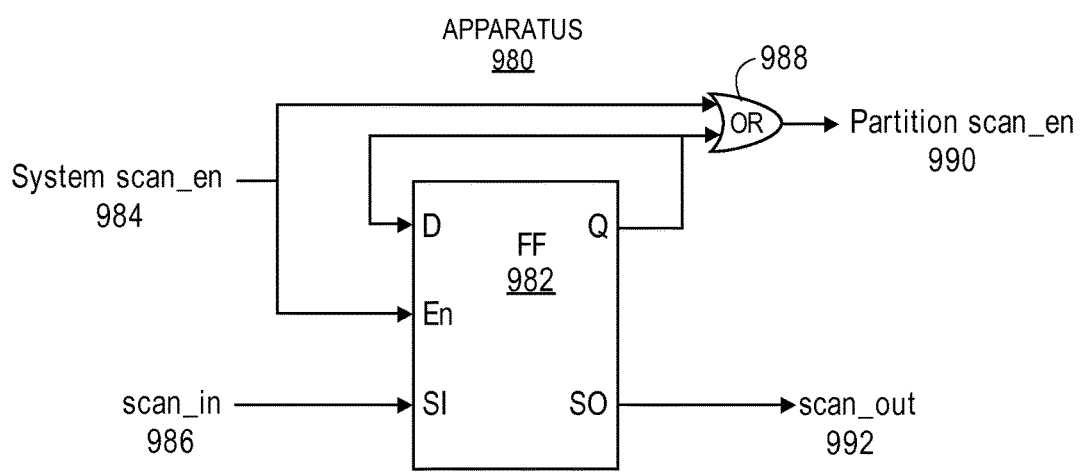
FIG. 9B illustrates an apparatus for generating a partition scan enable signal for each partition in accordance with one embodiment.

FIG. 9B illustrates an apparatus for generating a partition scan enable signal for each partition in accordance with one embodiment. The apparatus 980 (e.g., integrated circuit, circuit, device, etc.) includes a flip-flop 982 that receives a scan in signal 986, a system scan enable signal 984, and a D input coupled to logic OR gate 988. The flip-flop 982 generates a scan out signal 992 and a Q output signal that is provided to the OR logic gate 988. The OR logic gate 988 generates a partition scan enable signal 990 for enabling a partition of a multiple partition design.

Figure 9C:
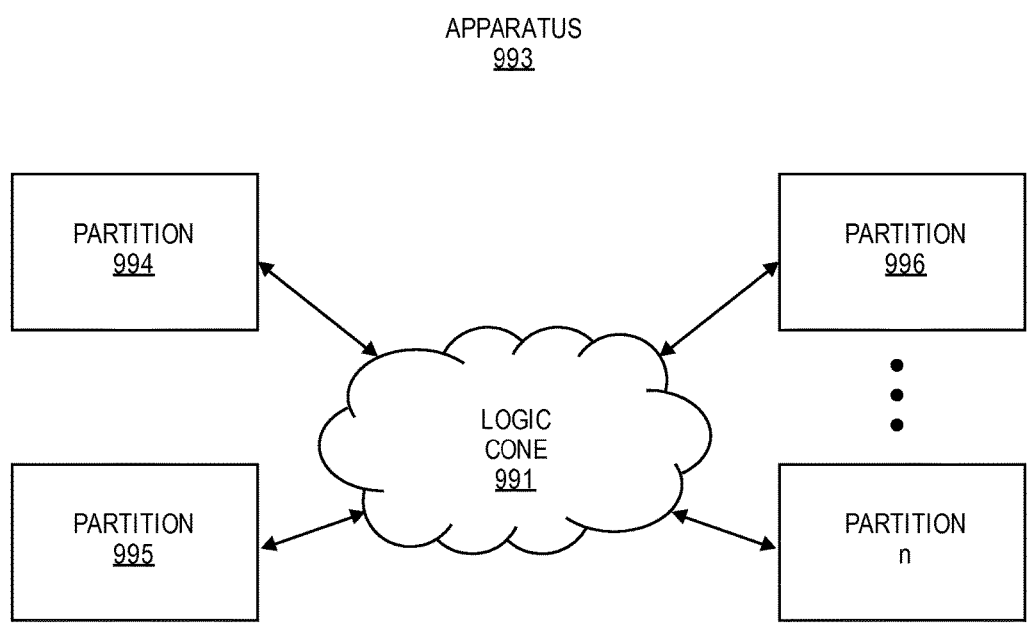
FIG. 9C illustrates an apparatus having multiple partitions (e.g., 2, 3, 4, . . . n) for testing functional circuitry in accordance with one embodiment.

Additional partitions (e.g., 3, 4, 16, 32, . . . n) can be included in an apparatus as illustrated in FIG. 9C in accordance with one embodiment. The apparatus 993 (e.g., integrated circuit, circuit, device, etc.) includes partitions 994, 995, 996, . . . n. Each partition includes a plurality of flip-flops and an independent scan enable partition signal (e.g., signal 990) for enabling or disabling a test mode for each partition. In one embodiment, certain partitions are enabled for a test mode while other partitions are disabled. Multiple customized partitions of scan flip-flops are created to optimize testing of functional circuitry (e.g., logic cone 990). The partitions are created such that the flip-flops in at least one partition are functionally updated by flip-flops in at least one other partition.

Figure 13:
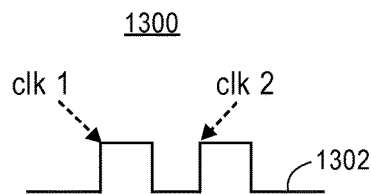
FIG. 13 illustrates a timing diagram 1300 of a double clock pulse in accordance with one embodiment.

In one example, a double clock pulse as illustrated in FIG. 13 will be used for a two partition design. In another example, a triple clock pulse will be used for a three partition design. In another example, a quadruple clock pulse will be used for a four partition design.

Figure 10:
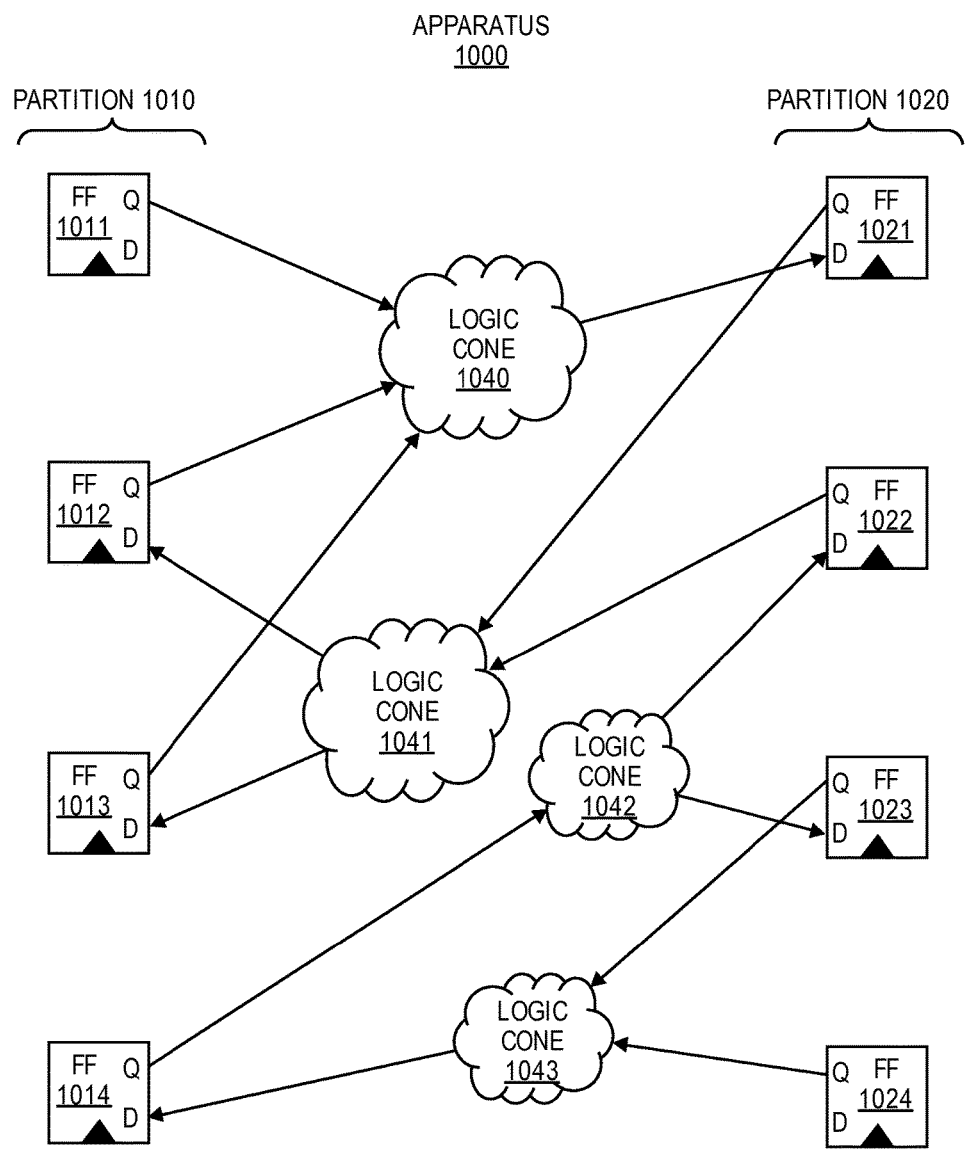
FIG. 10 illustrates an apparatus having a bipartite partition of scan flip-flops in accordance with one embodiment.

In one embodiment, a bipartite partition of scan flip-flops is created in which the flip-flops in one partition (e.g., partition 1010, partition 1020) are functionally updated by flip-flops in the other partition (e.g., partition 1020, partition 1010) as shown in FIG. 10. The two resulting sets of scan flip-flops 1011-1014 and 1021-1024 are called a paired bipartite partition of the apparatus 1000 (e.g., integrated circuit, circuit, device, etc.). The partition 1010 sends functional data in a functional mode or test data in a test mode from Q outputs into logic cones 1040 and 1042. This partition receives functional data or test data in D inputs from logic cones 1041 and 1043. The partition 1020 sends functional data in a functional mode or test data in a test mode from Q outputs into logic cones 1041 and 1043. This partition receives functional data or test data in D inputs from logic cones 1040 and 1042.

Figure 11:
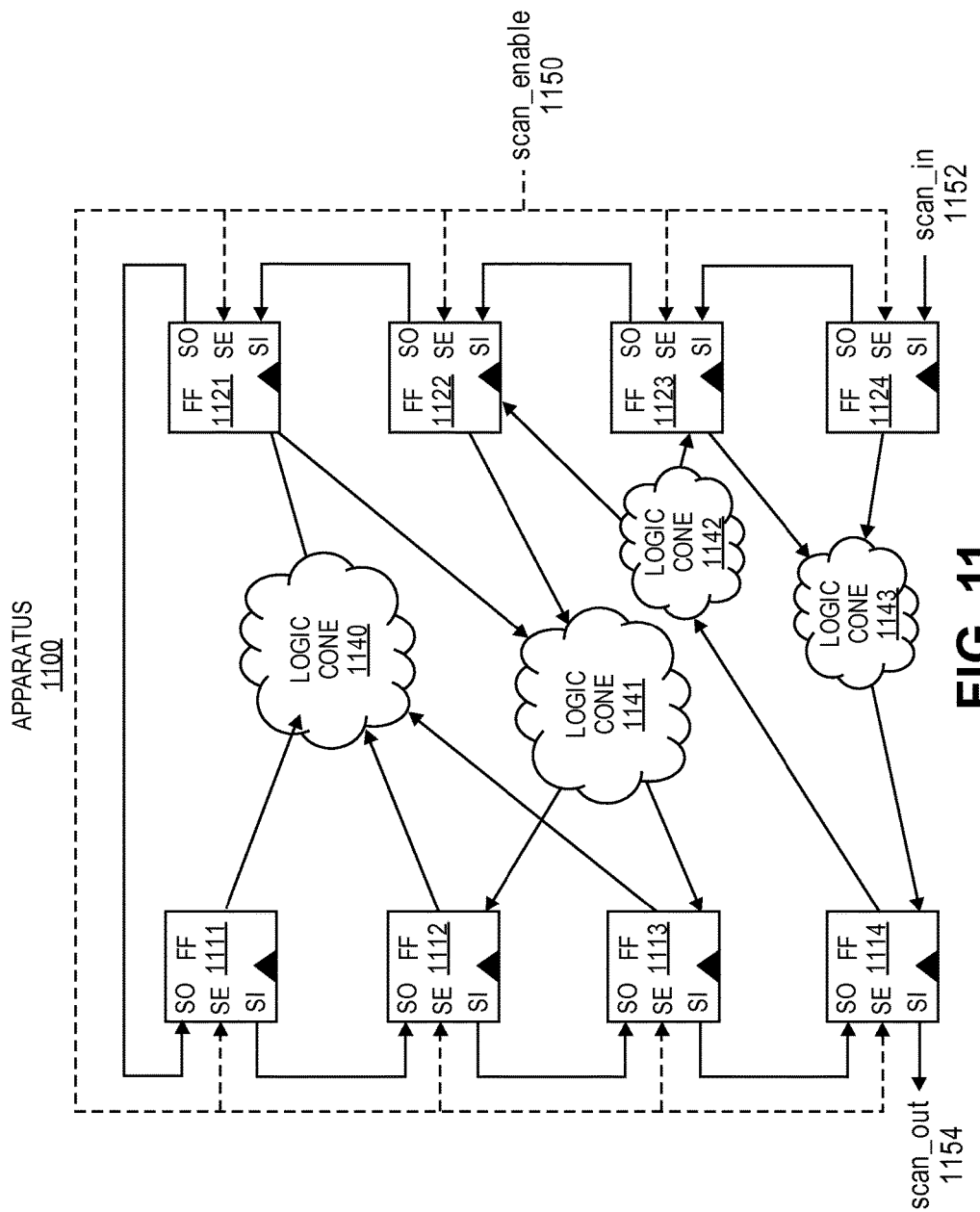
FIG. 11 illustrates an example of a scan data flow for scan flip-flops in accordance with one embodiment.

FIG. 11 illustrates an example of a scan data flow for scan flip-flops of an apparatus 1100 (e.g., integrated circuit, circuit, device, etc.) in accordance with one embodiment. The scan flip-flops 1111-1114 and 1121-1124 are coupled in a scan chain with a flip-flop 1124 receiving a scan in input signal. A scan out (SO) signal of FF 1124 is received as a scan in signal of FF 1123. A scan out (SO) signal of FF 1123 is received as a scan in signal of FF 1122. A scan out (SO) signal of FF 1122 is received as a scan in signal of FF 1121. A scan out (SO) signal of FF 1122 is received as a scan in signal of FF 1121. A scan out (SO) signal of FF 1121 is received as a scan in signal of FF 1111. A scan out (SO) signal of FF 1111 is received as a scan in signal of FF 1112. A scan out (SO) signal of FF 1112 is received as a scan in signal of FF 1113. A scan out (SO) signal of FF 1113 is received as a scan in signal of FF 1114. A scan out (SO) signal of FF 1114 is generated as an output for a tester or another circuit. A single scan enable signal 1150 enables or disables a test mode for all flip-flops in FIG. 11.

Figure 12:
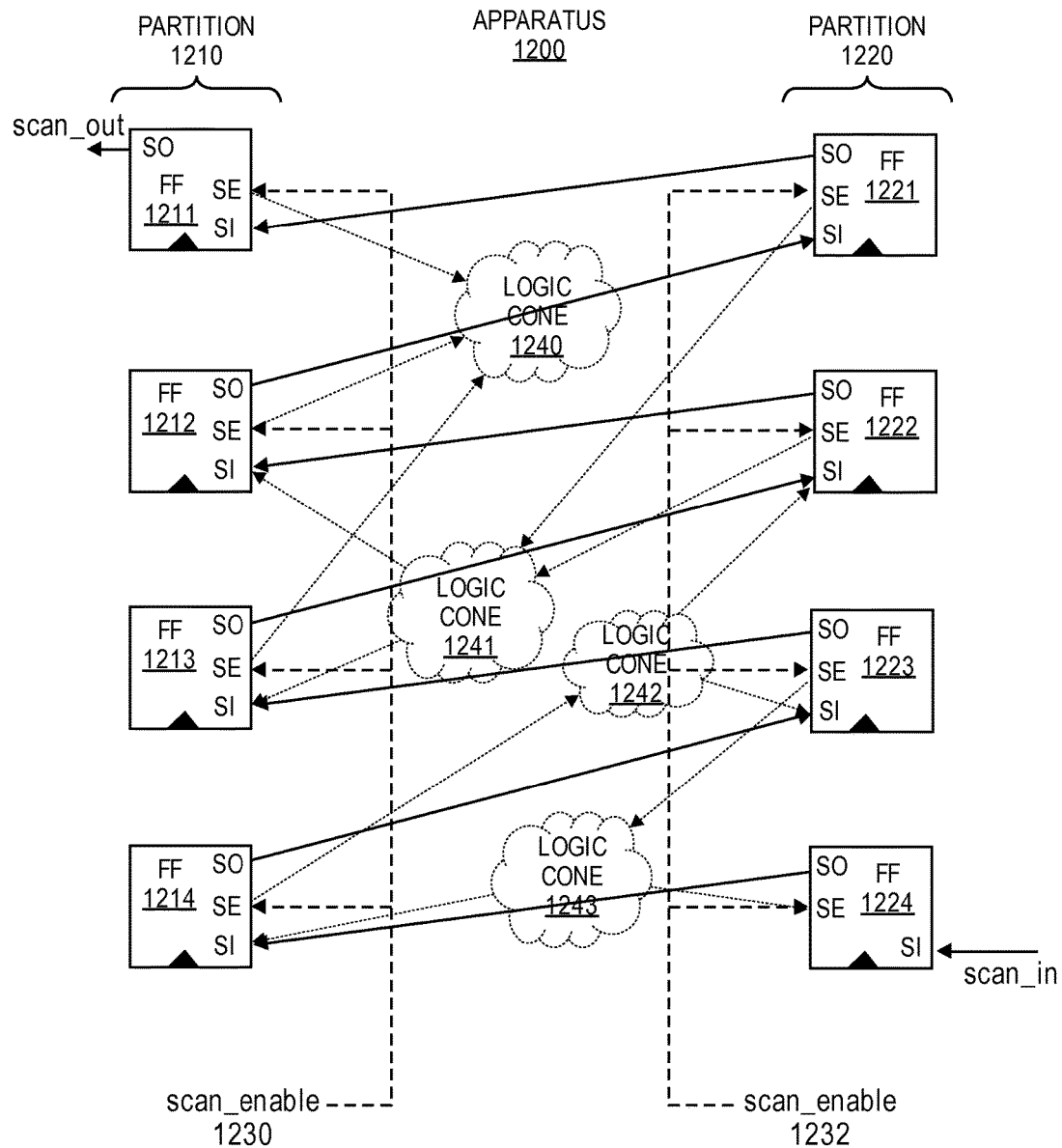
FIG. 12 illustrates an example of scan data flow for customized partitions of reordered scan flip-flops in accordance with one embodiment.

FIG. 12 illustrates an example of scan data flow of an apparatus 1200 (e.g., integrated circuit, circuit, device, etc.) for customized partitions of reordered scan flip-flops in accordance with one embodiment. Multiple customized partitions of scan flip-flops are created to optimize testing of functional circuitry. The partitions are created such that the flip-flops in one partition (e.g., partition 1210, partition 1220) are functionally updated by flip-flops in the other partition (e.g., partition 1220, partition 1210) as shown in FIG. 12. The two resulting sets of scan flip-flops 1211-1214 and 1221-1224 are called a paired bipartite partition. The partition 1210 sends functional data in a functional mode or test data in a test mode from outputs into logic cones 1240 and 1242. This partition receives functional data or test data in inputs from logic cones 1241 and 1243. The partition 1220 sends functional data in a functional mode or test data in a test mode from outputs of flip-flops into logic cones 1241 and 1243. This partition receives functional data or test data in inputs of the flip-flops from logic cones 1240 and 1242.

The scan flip-flops 1211-1214 and 1221-1224 are coupled in a scan chain with a flip-flop 1224 receiving a scan in input signal. A scan out (SO) signal of FF 1124 is received as a scan in signal of FF 1214. A scan out (SO) signal of FF 1214 is received as a scan in signal of FF 1223. A scan out (SO) signal of FF 1223 is received as a scan in signal of FF 1213. A scan out (SO) signal of FF 1213 is received as a scan in signal of FF 1222. A scan out (SO) signal of FF 1222 is received as a scan in signal of FF 1212. A scan out (SO) signal of FF 1212 is received as a scan in signal of FF 1221. A scan out (SO) signal of FF 1221 is received as a scan in signal of FF 1211. A scan out (SO) signal of FF 1211 is generated as an output for a tester or another circuit. A scan enable signal 1230 enables or disables a test mode for the flip-flops in the partition 1210 while a scan enable signal 1232 enables or disables a test mode for the flip-flops in the partition 1220.

In one embodiment, the flip-flops in the partition 1210 are enabled in a test mode while the flip-flops in the partition 1220 are disabled. The flip-flops in the partition 1220 can act as additional storage flip-flops for the flip-flops in the partition 1210 during the test mode to avoid having conflicts of different logical values for the flip-flops in the partition 1210. The flip-flops in the partition 1220 act in a similar manner as the additional flip-flop 652 in FIG. 6, except the flip-flops in the partition 1220 do not require additional circuit area because these flip-flops are already included in the design for utilization in a functional mode or test mode.

Figure 14:
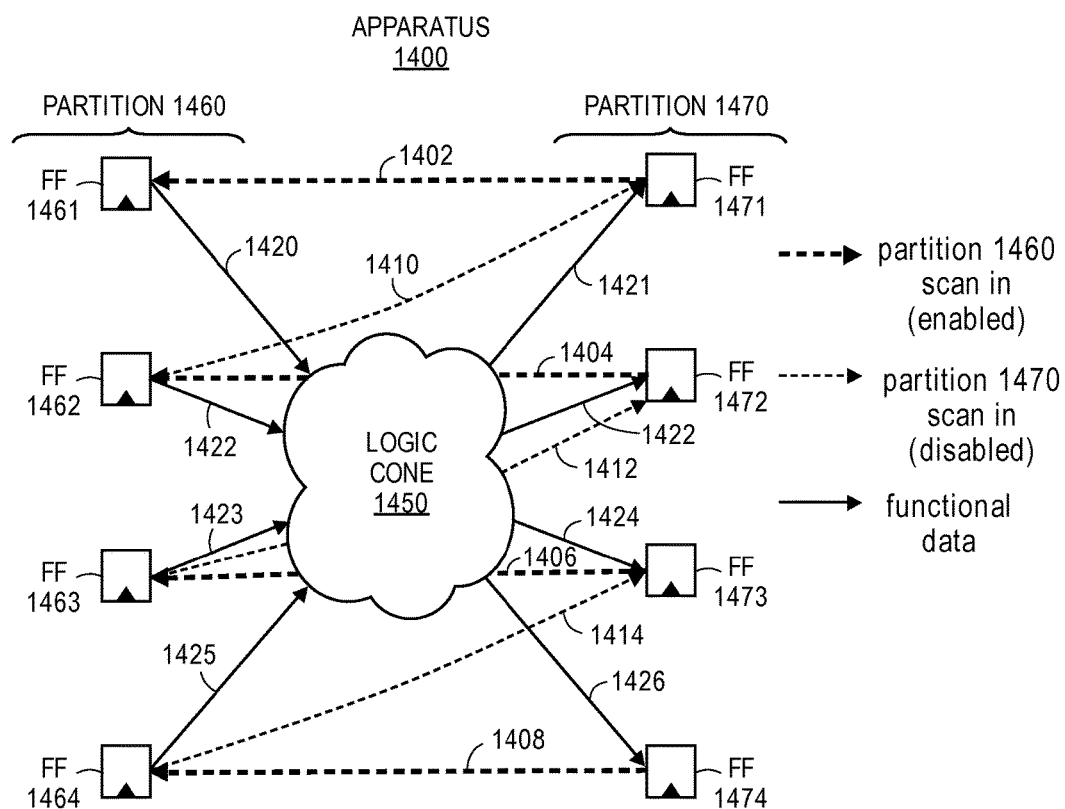
FIG. 14 illustrates a data flow of an apparatus having a partitioning of scan flip-flops in accordance with one embodiment.

FIG. 13 illustrates a timing diagram 1300 of a double clock pulse in accordance with one embodiment. The double clock pulse 1302 includes a clock 1 pulse and a clock 2 pulse. The double clock pulse 1302 can be used for generating a data flow as illustrated in FIG. 14. FIG. 14 illustrates a data flow of an apparatus 1400 (e.g., integrated circuit, circuit, device, etc.) having a partitioning of scan flip-flops in accordance with one embodiment. Multiple customized partitions of scan flip-flops are created to optimize testing of functional circuitry (e.g., logic cone 1450). The partitions are created such that the flip-flops in one partition (e.g., partition 1460, partition 1470) are functionally updated by flip-flops in the other partition (e.g., partition 1470, partition 1460) as shown in FIG. 14. The two resulting sets of scan flip-flops 1461-1464 and 1471-1474 are called a paired bipartite partition. The partition 1460 sends functional data in a functional mode or test data in a test mode from outputs of flip-flops into logic cones 1450.

In one example, the partition 1460 is enabled while the partition 1470 is disabled. The double clock pulse 1302 is applied to the partitions. Prior to a rising edge of the clock 1 pulse, the partition 1460 stores a first test vector data pattern (e.g., V1) while the partition 1470 stores a second test vector data pattern (e.g., V2). After the rising edge of the clock 1 pulse, the second test vector data pattern is loaded from the partition 1470 into the partition 1460 while the first test vector data pattern is applied to the logic cone 1450 and then output data is captured by the partition 1470 as f(V1) with f representing the logic cone 1450. Then, the clock 2 pulse is applied which causes the partition 1470 to send the output data, f(V1) to the partition 1460. This output data represents stuck-at-fault test data which indicates functional correctness of the logic cone 1450. Also, after the clock 2 pulse is applied, output data is captured by the partition 1470 as f(V2) with f representing the logic cone 1450. This output data represents transition delay fault test data which indicates transitional timing faults of the logic cone 1450. Thus, the test mode of the partition 1460 allows simultaneous testing and generation of stuck-at-fault test data and transition delay fault test data. This testing is more efficient and requires less tester time.

Scan flip-flops that are part of an odd graph cycle can be excluded from the initial bipartite partition and dealt with as a separate bipartite partition. In one example, any scan flip-flops that form a cycle of length one may have a flip-flop inserted to break such a cycle and ensure that it can be partitioned. These are logic paths where a flip-flop directly updates itself possibly through logic. Scan flip-flops can be inserted to ensure each paired partition has the same cardinality.

Transition delay fault testing and stuck-at fault testing are performed in a combined double-clock test sequence as illustrated in FIGS. 13 and 14. In one example, one such sequence is performed for each direction, either partition 1460 to partition 1470 or partition 1470 to partition 1460. The following description applies to the partition 1460 to partition 1470 test direction. The stuck-at fault vector IV is generated and scanned into the partition 1460 partition while the transition fault vector TV is generated and scanned into the partition 1470 partition. The double-clock sequence is performed while scan enable partition 1460 is asserted and scan enable partition 1470 is released. The first clock pulse launches the IV vector from partition 1460 to partition 1470 and loads the TV vector into partition 1460. The second clock launches the TV vector from partition 1460 to partition 1470 and loads the stuck-at results into partition 1460. At the end of the double-clock pulse sequence, the stuck-at fault results are captured into the partition 1460 while the transition delay faults are captured in the partition 1470. This procedure is repeated for the partition 1470 to partition 1460 test direction.

The partitioning approach enables sufficient controllability but must account for network cliques. In this case, either the number of partitions to enable controllability of a circuit must be greater than the maximal clique size, or the flip-flops forming the clique must be replaced by enhanced scan flip-flops as described herein.

Further, to reduce the physical impacts of partitioning on a design such as long wires or scan shift mode timing constraints, a flip-flop can be placed into a partition and then replaced by an enhanced scan flip-flop. This selective enhanced scan flip-flop replacement coupled with partitioning allows for increased scan control effectiveness while minimizing the physical cost of the implementation.

Partitions and enhanced scan flip-flops can be used to ensure controllability of RAM data structures, in the same manner as the methods described for the standard cell logic. RAM controllability requires multiple IV vectors in order to ensure sufficient control of the RAM inputs and outputs allowing for the loading in and reading out of the required RAM data during the IV vectors.

The present design includes individual control of a partition using scan enable signals and this provides an ability to use multiple partitions to feed into a single active functional mode partition. This allows for multiple delay fault patterns for a single partition to be loaded in one IV vector.

Functional mode timing sensors, as specified in U.S. Provisional Application No. 62/146,412, entitled "Circuitry and Method for Critical Path Timing Speculation using Edge Sensitive Sampling", filed on Apr. 13, 2015, or other circuitry of similar functionality, are used with the apparatuses or devices disclosed herein during enhanced at-speed vector testing. These functional mode timing sensors, timing test points, increase the visibility of the at-speed tests by detecting timing violations and indicating that the violation occurred. These functional mode timing sensors help to correct a masking issue in which follow-on clock cycles remove, or overwrite, an incorrect value in a flip-flop such that the test passes even when an at-speed vector TV clock cycle produced a timing violation.

In one example, the timing sensors are used to detect timing violations during the vector pattern. The sensor function could also be implemented using other circuit techniques without deviating from embodiments of the present disclosure.

By combining the idea of multicycle IV compression and allowing multiple initialization patterns to be loaded in for a single clock cycle, with the use of functional critical path timing sensors, the at-speed vectors can be further enhanced. The multiple clock cycle TV initialization patterns allow a circuit to be pushed into a desired state during an at-speed test. This increase in controllability enhances the testability of the circuit. Coupled with the enhanced visibility provided by a functional mode timing sensor, extremely targeted at-speed vectors result.

Figure 15:
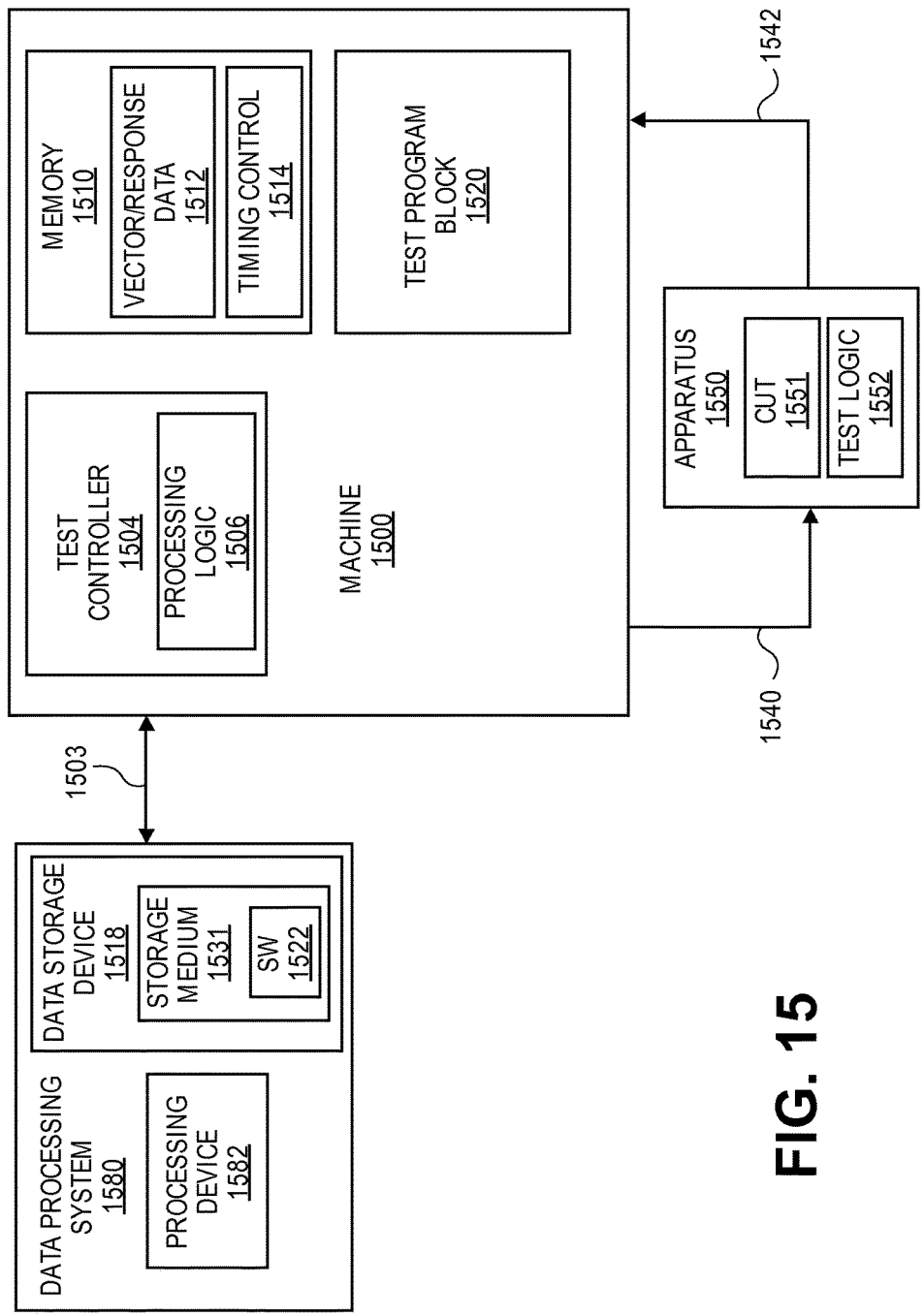
FIG. 15 illustrates a diagrammatic representation of a machine in the exemplary form of a computer system 1500 within which a set of instructions, for causing the machine (e.g., tester, ATE) to perform any one or more of the methodologies discussed herein, may be executed.

FIG. 15 illustrates a diagrammatic representation of a machine in the exemplary form of a computer system 1500 within which a set of instructions, for causing the machine (e.g., tester, ATE) to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in a client-server network environment, or as a peer machine in a peer-to-peer (or distributed) network environment. The machine may be a tester, automatic test equipment, or other data processing means for testing functional circuitry. The machine may be coupled to a data processing system 1502 that includes a processing device (processor) 1582, memory 1584 (e.g., a main memory (e.g., read-only memory (ROM), flash memory, dynamic random access memory (DRAM) such as synchronous DRAM (SDRAM) or Rambus DRAM (RDRAM), etc.), a static memory (e.g., flash memory, static random access memory (SRAM), etc.), and a data storage device 1518, which communicate with each other via a communication link.

The machine includes a test controller 1504 for controlling test sequences for testing an apparatus 1550 having a circuit under test (CUT) 1551 and test logic 1552. The test logic can be embedded with the CUT 1551 in accordance with apparatuses of the present disclosure. The test controller represents one or more general-purpose processing devices such as a microprocessor, central processing unit, or the like. The test controller 1504 may include one or more special-purpose processing devices such as an application specific integrated circuit (ASIC), a field programmable gate array (FPGA), a digital signal processor (DSP), network processor, or the like. The test controller 1504 is configured to execute the processing logic 1506 for performing the operations discussed herein.

The data storage device 1518 may include a machine-accessible storage medium 1531 on which is stored one or more sets of instructions (e.g., software 1522) embodying any one or more of the methodologies or functions described herein. The software 1522 may also reside, completely or at least partially, within the main memory and/or within the processor 1582 during execution thereof by the data processing 1580.

The memory 1510 may be a form of machine-accessible storage medium and may be used to store data 1512 including vector data test patterns and response data and timing control information 1514. The timing control information stores a timing of stimulus values of the vector data test patterns. The test programs block 1520 performs test program execution for testing of a circuit under test 1550. Vector data test patterns (e.g., initialization vectors, transition vectors) are applied to the CUT 1550 via one or more channels of communication link 1540 and response data is received from the CUT 1550 via a communication link 1542.

While the machine-accessible storage medium 1531 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instructions for execution by the machine and that cause the machine to perform any one or more of the methodologies of the present invention. The term "machine-accessible storage medium" shall accordingly be taken to include, but not be limited to, solid-state memories, optical media, and magnetic media.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed description which follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, calibrating discussions utilizing terms such as "processing", "computing", "calculating", "determining", "displaying" or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes a machine readable storage medium (e.g., read only memory ("ROM"), random access memory ("RAM"), magnetic disk storage media, optical storage media, flash memory devices, etc.).

In one embodiment, an apparatus provides improved transition delay fault testability by adding scan override inputs to a selected number of scan flip-flops. The override input may be added on a per flip-flop basis. The override inputs may be combined into an override circuit to reduce area cost by sharing OR gates among a set of flip-flops. Selected flip-flops can be divided into a few sets with each set sharing an independent override signal and an OR gate. In this case, each set will be independently controlled through its dedicated override signal. In one example, the dedicated override signals are controlled by flip-flops and the override signal are loaded via the IV vectors. The scan flip-flops are selected such that overriding the scan enable enhances transition delay fault coverage or testability by increasing controllability. In another example, ATPG vectors are modified such that modified TV vectors are generated that enhance transition delay fault coverage or testability.

In another embodiment, an apparatus provides improved transition delay fault testability by replacing selected scan flip-flops with enhanced scan flip-flops that directly supply TV transition delay fault vectors. The override inputs can be provided on a per-flop basis. The override inputs can be combined into an override circuit to reduce area cost. The scan flip-flops are selected such that supplying selected TV vectors enhances transition delay fault coverage or testability by increasing controllability and minimizes area overhead.

In another embodiment, an apparatus is designed by segregating scan flip-flops to form bipartite partitions each with a separate scan enable. Single-cycle scan flip-flops can be partitioned by adding an additional flip-flop. Odd-cycle scan flip-flops can be segregated into separate partitions and recursively partitioned. Flip-flops may be added to a first partition to ensure that the first partition has the same cardinality as a paired second partition.

In another embodiment, an apparatus is designed by reordering scan chains such that alternate or adjacent scan flip-flops are drawn from paired bipartite partitions. Non-paired partitions can be connected on the same scan chain with an additional scan flip-flop inserted between them. Selected scan flip-flops can be replaced with enhanced scan flip-flops to facilitate bipartite partitioning.

In one example, the scan chains are reordered such that alternate or adjacent scan flip-flops are drawn from paired bipartite partitions while also accounting for flip-flop physical placement to minimize DFT related wire cost and facilitate timing during the TV vector. Wire length is minimized by reordering scan chains within each partition. Partitions are chosen factoring in flip-flop location such that the total scan-related wire length is minimized. Flip-flop location is used as a factor to minimize the impact of flop-to-flop scan chain timing.

In another embodiment, selected scan flip-flops are replaced with enhanced scan flip-flops to minimize flip-flop to flip-flop timing and wire length impacts of partitioning. In one example, a flip-flop is replaced with an enhanced flip-flop to fix timing violations on the scan-chain shift path. In another example, a flip-flop is replaced with an enhanced flip-flop to minimize wire length between flip-flops on a scan-chain. In another example, double-clock at-speed test sequences are performed such that the stuck-at fault results are available in one paired partition and the transition fault results are available in the other paired partition. In another example, override circuitry selection for the selected launch flip-flops reduces area overhead and cost.

In another embodiment, an apparatus with test logic is designed to have vector compression by having multiple TV vectors per IV vector. The number of partitions is increased to allow for multiple cycles of TV per IV. A subset of partitions is targeted to be functionally active during the TV vectors. Patterns spanning multiple clock TV cycles are loaded during the IV vector and clocked through the targeted logic cone during the multiple TV vectors.

In another embodiment, a method of clocking through RAMs using multiple partitions and TV vectors of test logic of an apparatus includes loading multiple functional clock cycles worth of RAM address, data and control values into the partitions during the IV vector. The method further includes writing the RAM data into the RAM during a TV vector clock cycle, reading the RAM data out of the RAM during a TV vector clock cycle.

The RAM data read out during a TV vector is used as delay fault data in downstream logic cones. In one example, the RAM data, control and addressing logic is used to write values into and out of a RAM from upstream delay fault data.

In another embodiment, an apparatus is designed using multiple TV vectors per IV vector to enhance functional at-speed vector test controllability. The number of partitions is increased to allow for multiple cycles of TV per IV. A subset of partitions is targeted to be functionally active during the TV vectors. Patterns spanning multiple TV clock cycles are loaded during the IV vector and clocked through the targeted logic cone during the multiple TV vectors. The number of TV cycles in a test pattern exceeds the number of initialization patterns for the targeted logic cone loaded during the IV cycle. The number of TV cycles in a test pattern matches the number of initialization patterns for the targeted logic cone loaded during the IV cycle.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus comprising:
   functional circuitry for performing functional operations; and
   test logic coupled to the functional circuitry to enhance timing delay fault coverage for the functional circuitry with at-speed test sequences, the test logic includes a plurality of partitions of scan flip-flops and an independent partition scan enable input signal for each partition for enabling or disabling each partition;
   wherein the plurality of partitions are arranged in scan chains configured with alternate or adjacent flip-flops selected from first and second partitions, the test logic configured to enable the first partition and disable the second partition during a first test sequence and to disable the first partition and enable the second partition during a second test sequence, the test logic configured to enable scanning in second test data from one of the first and second partitions into the other of the first and second partitions while the other of the first and second partitions outputs first test data to a portion of the functional circuitry.

2. The apparatus of claim 1, wherein the test logic further comprises:
   override circuitry including at least one logic gate coupled to at least one scan flip-flop, each logic gate to receive a scan enable input signal and a scan override input signal while generating the partition scan enable input signal that is sent to a corresponding scan flip-flop for enabling or disabling a test mode of the scan flip-flop.

3. The apparatus of claim 1, wherein the test logic controls stuck-at test sequences and at-speed test sequences, wherein resulting data of a stuck-at fault test sequence associated with a first clock cycle are available in the first partition and resulting data of a transition fault test sequence associated with a second clock cycle are available in the second partition.

4. The apparatus of claim 1, wherein at least one flip-flop of the second partition temporarily acts as an extra flip-flop for storing a data value of the first partition when the first partition is enabled and the second partition is disabled for the first test sequence.

5. The apparatus of claim 1, wherein scan chains of a design are reordered prior to fabrication of the apparatus, wherein in a reordered scan chain alternate or adjacent scan flip-flops are selected from different partitions to minimize timing delay fault testing related wiring cost and facilitate timing during a transition vector of a test sequence.

6. The apparatus of claim 1, wherein the plurality of partitions of scan flip-flops provide vector compression by having multiple transition vectors per initialization vector with each partition corresponding to a transition vector or an initialization vector.

7. The apparatus of claim 1, wherein the functional circuitry includes random access memory (RAM) and the plurality of partitions of scan flip-flops are capable of clocking through the RAM with transition vectors.

8. The apparatus of claim 7, wherein multiple function clock cycles worth of RAM address, data and control values are loaded into the plurality of partitions during the initialization vector, wherein data of the RAM data is written into the RAM during a transition vector clock cycle.

9. The apparatus of claim 8, wherein the data of the RAM is read out of the RAM during a transition vector clock cycle and this data is used as delay fault data in downstream logic cones having additional functional circuitry.

10. A method for testing functional circuitry, the method comprising:
receiving a circuit design having functional circuitry;
providing customized test logic to be embedded instrumentation for the functional circuitry, the test logic including a plurality of partitions of scan flip-flops and an independent partition scan enable input signal for each partition for enabling or disabling each partition;
segregating flip-flops of the test logic into launch and capture flip-flops, one of the first and second partitions defining the launch flip-flops, and the other of the first and second partitions defining the capture flip-flops; and
scanning in second test data from one of the first and second partitions into the launch flip-flops while launching first test data from the launch flip-flops into a portion of the functional circuitry.

11. The method of claim 10, further comprising:
performing a test sequence with double capture clock cycles at-speed of the functional circuitry while asserting the override circuitry for the selected launch flops.

12. The method of claim 11, wherein the test logic includes override circuitry configured to provide partial control of a transition vector (TV) of a test sequence rather than having the TV derived from an initialization vector by the functional circuitry.

13. The method of claim 10, wherein the test logic includes override circuitry having selected scan enable circuitry.

14. The method of claim 10, wherein the test logic includes override circuitry having selected enhanced scan circuitry or selected alternate update circuitry.

15. A computer-readable storage medium comprising executable instructions to cause a processor to perform operations, the instructions comprising:
receiving a circuit design having functional circuitry;
providing customized test logic to be embedded instrumentation for the functional circuitry, the test logic including a plurality of partitions of scan flip-flops and an independent partition scan enable input signal for each partition for enabling or disabling each partition;
segregating flip-flops of the test logic into launch and capture flip-flops, one of the first and second partitions defining the launch flip-flops, and the other of the first and second partitions defining the capture flip-flops; and
scanning in second test data from one of the first and second partitions into the launch flip-flops while launching first test data from the launch flip-flops into a portion of the functional circuitry.

16. The computer-readable storage medium of claim 15, further comprising:
performing a test sequence with double capture clock cycles at-speed of the functional circuitry while asserting the override circuitry for the selected launch flops.

17. The computer-readable storage medium of claim 16, wherein the test logic includes override circuitry configured to provide partial control of a transition vector (TV) of a test sequence rather than having the TV derived from an initialization vector by the functional circuitry.

18. The computer-readable storage medium of claim 15, wherein the test logic includes override circuitry having selected scan enable circuitry.

19. The computer-readable storage medium of claim 15, wherein the test logic includes override circuitry having selected enhanced scan circuitry or selected alternate update circuitry.

* * * * *